(12) United States Patent
Tanaka et al.

(10) Patent No.: US 6,776,872 B2
(45) Date of Patent: Aug. 17, 2004

(54) DATA PROCESSING APPARATUS FOR SEMICONDUCTOR PROCESSING APPARATUS

(75) Inventors: Junichi Tanaka, Tsuchiura (JP); Toshio Masuda, Toride (JP); Akira Kagoshima, Kudamatsu (JP); Shoji Ikuhara, Hikari (JP); Hideyuki Yamamoto, Kudamatsu (JP)

(73) Assignees: Hitachi, Ltd., Tokyo (JP); Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 10/087,982

(22) Filed: Mar. 5, 2002

(65) Prior Publication Data

US 2003/0168171 A1 Sep. 11, 2003

(51) Int. Cl.[7] .......................... H05H 1/00; C23C 16/00
(52) U.S. Cl. ................. 156/345.24; 118/712; 118/695; 438/14
(58) Field of Search ..................... 156/345.24; 118/712, 118/695; 438/14, 5, 7, 8, 9, 708

(56) References Cited

U.S. PATENT DOCUMENTS

| 5,591,299 A | * | 1/1997 | Seaton et al. ................ 700/121 |
| 6,077,386 A | * | 6/2000 | Smith et al. ............ 156/345.24 |
| 2003/0003607 A1 | * | 1/2003 | Kagoshima et al. .......... 438/14 |

* cited by examiner

*Primary Examiner*—Parviz Hassanzadeh
(74) *Attorney, Agent, or Firm*—Antonelli, Terry, Stout & Kraus, LLP

(57) ABSTRACT

A data processing apparatus for a semiconductor manufacturing apparatus includes a semiconductor manufacturing apparatus for executing processing for a wafer, a data collecting semiconductor device for collecting processing data generated in association with the processing, and a data copying semiconductor device for extracting the processing data collected in the data collecting semiconductor device and for producing a copy of the processing data. The apparatus may include a data analyzer for analyzing the data copy produced by the data copying semiconductor device and for diagnosing a processing state of the processing apparatus.

8 Claims, 13 Drawing Sheets

FIG. 8

| COPY DEVICE SPECIFICATION |
|---|
| DEVICE NAME INCLUDES [ ] |
| RECIPE NO. IS [ ] |
| DATE RANGES FROM [ ] TO [ ] |

DATA PROCESSING APPARATUS FOR SEMICONDUCTOR PROCESSING APPARATUS

BACKGROUND OF THE INVENTION

The present invention relates to a data processing apparatus for a semiconductor manufacturing apparatus, and in particular, to a data processing apparatus for a semiconductor manufacturing apparatus suitable for a semiconductor manufacturing apparatus to conduct micromachining.

FIG. 12 shows a configuration of a data processing apparatus for a semiconductor manufacturing apparatus in the prior art. The configuration of FIG. 12 includes an etching system 1 of the semiconductor manufacturing apparatus, etching chambers 11 and 12 as processing chambers of the etching system 1, and sensors 13 and 14 respectively of the etching chambers 11 and 12. Each of the sensors 13 and 14 measures various physical quantities, for example, a degree of vacuum in a vacuum chamber, plasma density, and an output from a plasma emission spectrometer to produce sensor data. The configuration further includes a controller 15 of the etching system 1 to obtain wafer processing information items such as a type of a wafer being processed and a processing condition for the wafer. Reference numeral 2 indicates a data collector. Reference numeral 21 indicates a data processor of the data collector 2. The data processor 21 collects the sensor data and the wafer processing information to store them in a database 22. Reference numeral 3 indicates a data analyzer which accesses the database (DB) 22 via the data processor 21 to acquire necessary data and analyzes the data. The operator of the semiconductor manufacturing apparatus can operate the semiconductor manufacturing apparatus according to results of the analysis.

FIG. 13 shows a sequence of processing executed by the data processor 21. As can be seen from FIG. 13, when the etching system 1 includes a plurality of etching chambers 11 and 12, the data processor 21 obtains, for example, alternately sensor data from the sensors 13 and 14 of the respective chambers 11 and 12 to store the data in the database 22.

SUMMARY OF THE INVENTION

Since the sensor data includes, for example, information with respect to time of a plasma emission spectrum (several thousand of data items per second) from the plasma emission spectrometer described above, a large amount of information items must be processed. Therefore, the data analyzer 3 takes a long period of time to obtain sensor data from the data collector 2 and imposes at the same time a load onto the data collector 2. This hinders the data collecting operation of the data collector 2. Particularly, when the etching system includes a plurality of etching chambers as shown in FIG. 12, the data collector must alternately handle the data items from the sensors in a duplicated manner as shown in FIG. 13. Therefore, it is difficult to guarantee a free period of time to be allocated for the data analyzer 3 to execute data processing, for example, a data extraction request. That is, in the data processing apparatus of the prior art, it is difficult to guarantee a wait period of time to execute processing such as analysis, and hence usability of the apparatus is deteriorated.

It is therefore an object of the present invention, which has been devised to remove the problem, to provide a data processing apparatus for a semiconductor manufacturing apparatus with high usability in which the wait time required for the processing is reduced.

To solve the problem, there is provided according to the present invention a data processing apparatus for a semiconductor manufacturing apparatus comprising a semiconductor manufacturing apparatus for executing processing for a wafer, a data collecting semiconductor device for collecting processing data generated in association with the processing, and a data copying semiconductor device for extracting the processing data collected in said data collecting semiconductor device and for producing a copy of the processing data. Moreover, the data processing apparatus may comprise data analyzing means for analyzing the data copy produced by said data copying semiconductor device and for diagnosing a processing state of said processing apparatus.

Other objects, features and advantages of the invention will become apparent from the following description of the embodiments of the invention taken in conjunction with the accompanying drawings.

BRIEF DESCRIPTION OF THE DRAWINGS

FIG. 8 is a diagram showing an example of an operation display screen presented on a display of a data copier;

DESCRIPTION OF THE EMBODIMENTS

Figure 1:
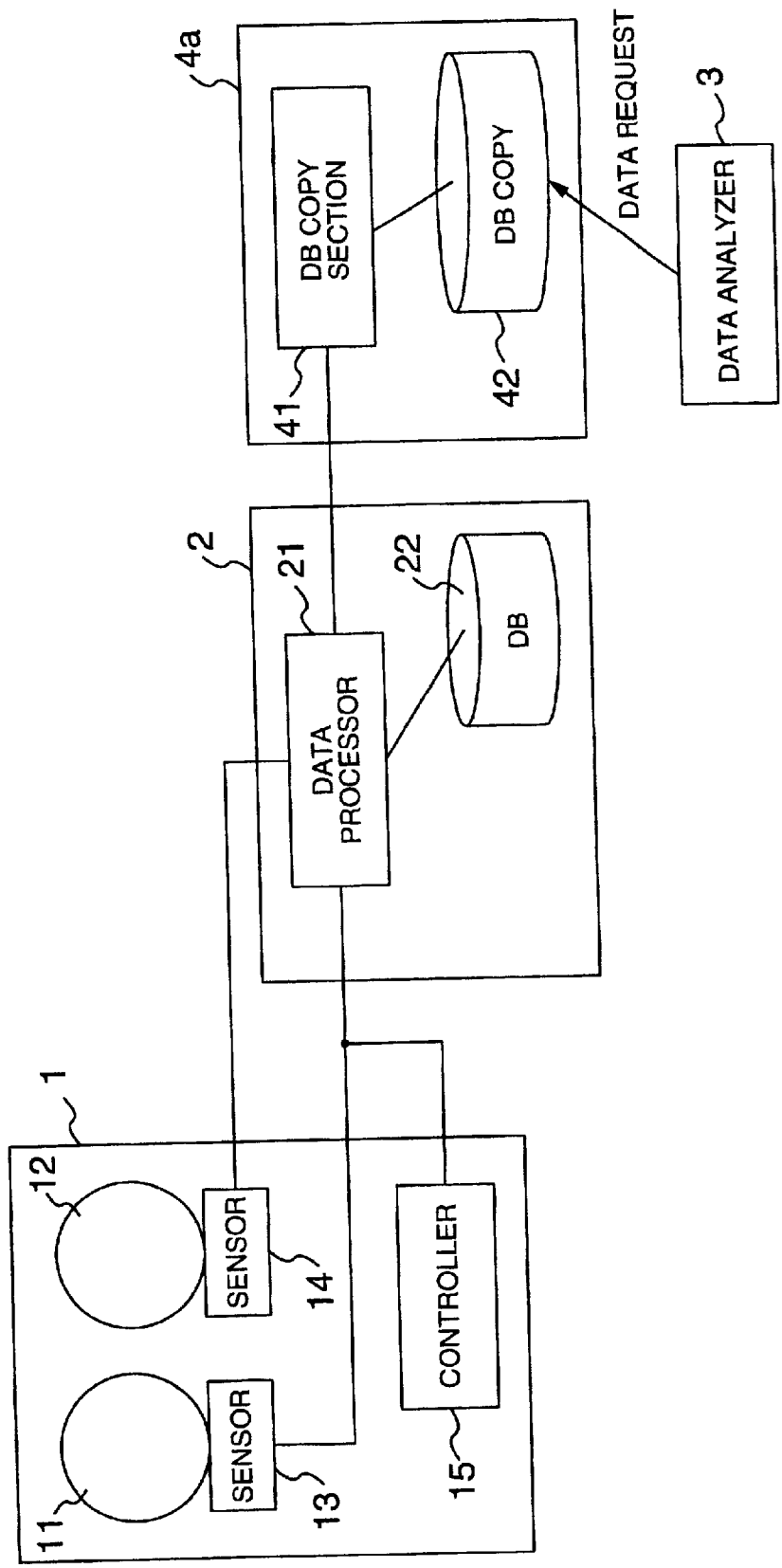
FIG. 1 is a diagram showing a configuration of a data processing apparatus for a semiconductor manufacturing apparatus in an embodiment of the present invention.
Figure 12:
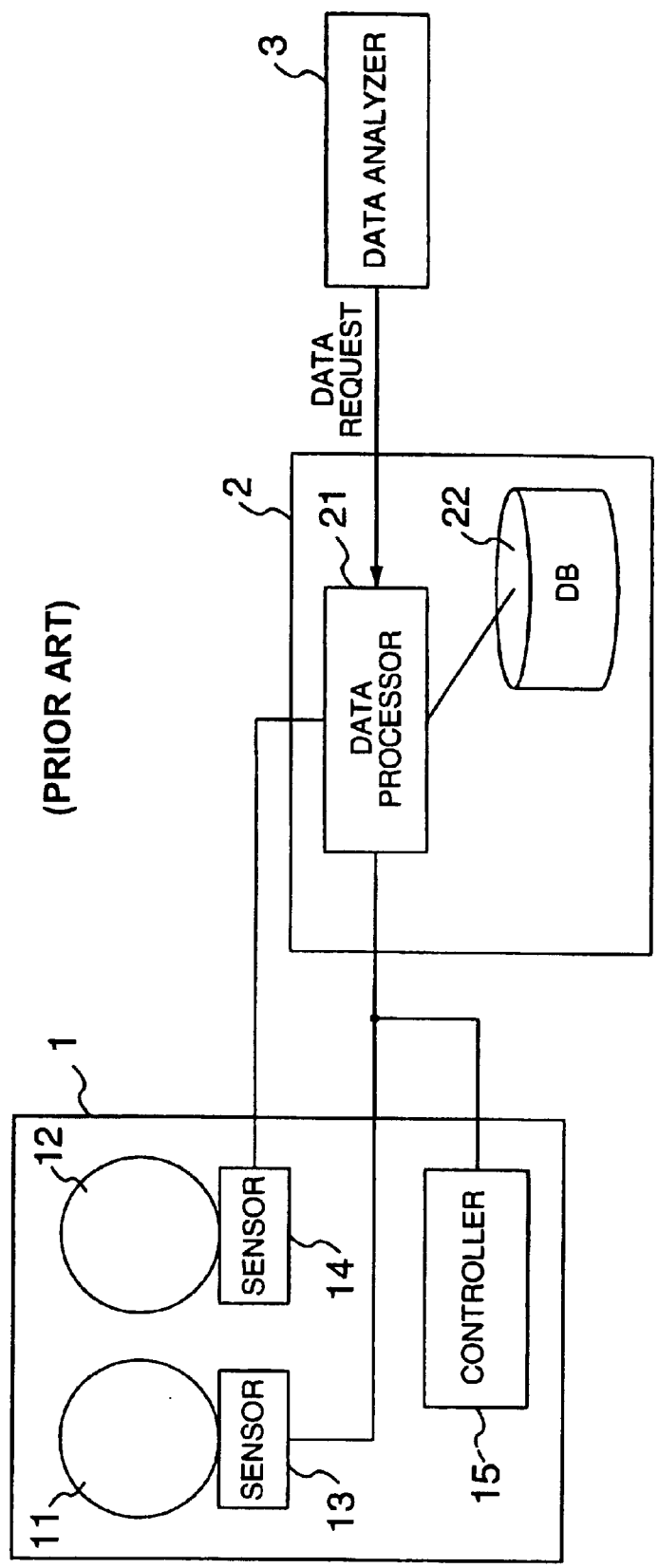
FIG. 12 is a diagram showing a configuration of a data processing apparatus for a semiconductor manufacturing apparatus of the prior art.
Figure 13:
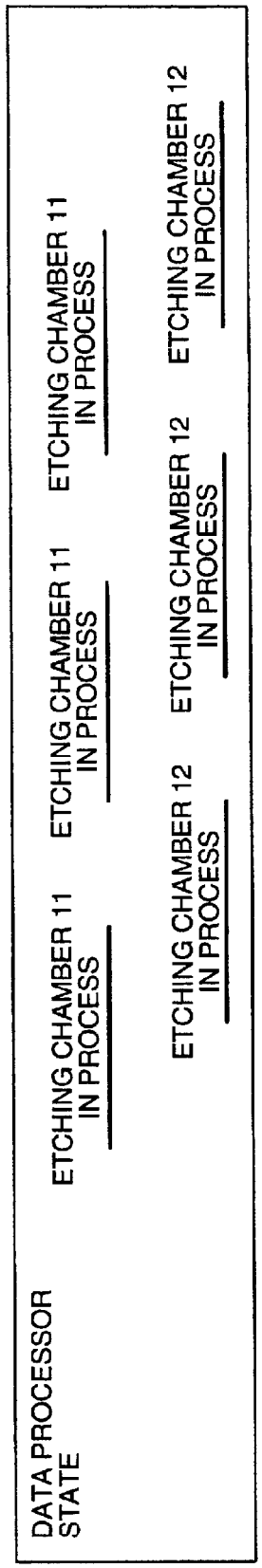
FIG. 13 is a diagram for explaining division of data processing.

Referring now to the accompanying drawings, description will be given of an embodiment of the present invention. FIG. 1 shows a configuration of a data processing apparatus for a semiconductor manufacturing apparatus in an embodiment of the present invention. The data processing apparatus shown in FIG. 1 includes a data copying semiconductor device 4a, a database copying semiconductor device 41, a database copy 42 produced by copying a database 22. In FIG. 1, the same constituent components as those of FIG. 12 are assigned with the same reference numeral and description thereof will be avoided.

As described above, the data processor 21 of the data collector 2 collects sensor data from the sensors 13 and 14 and wafer processing information from the controller 15 for each wafer to store the respective data in the database 22. The sensor data thus obtained for each wafer is stored as a sensor data file in the database 22. It is desirable that the sensor data for each wafer is related to the wafer processing data for the wafer using, for example, a list of correspondence therebetween.

The database copying semiconductor device 41 obtains the sensor data for each wafer, the wafer processing information for each wafer, and the list of correspondence therebetween to store these items in the database copy 42. The database copying semiconductor device 41 produces the copy during a free period of time of the data collector 2. When such a free period of time is insufficient, it is desirable that the processor 21 transfers the obtained sensor data to the copying device 4a at the end of each sensor data sampling period of time before the processor 21 register the sensor data to the database 22. This reduces the data transfer time when compared with a case in which the data stored in the database 22 is read therefrom and is transferred to the copying semiconductor device 4a. When the quantity of sensor data varies between the sensors, for example, because only one of the etching chambers is used, the data can be transferred to the copying semiconductor device 41 in a period of time in which the data collector 2 is operating with a lower load.

Since the copy of the wafer processing data including the sensor data for each wafer, the processing information for each wafer, and the correspondence list is stored in the database copy 42, the data analysis can be conducted without imposing any load onto the data collector 2. That is, the data analyzer 3 can access the database copy 42 without paying attention to the load imposed on the data collector 2.

Figure 2:
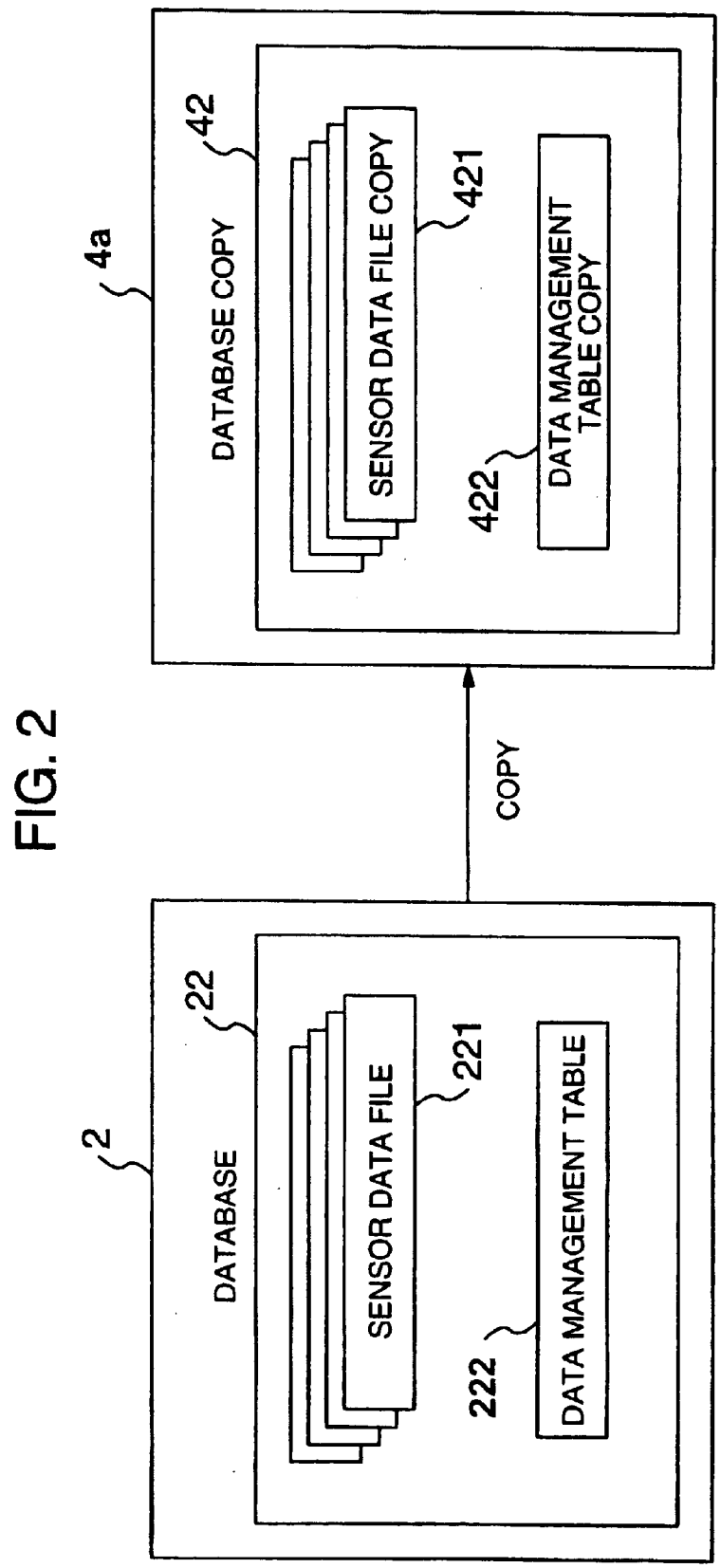
FIG. 2 is a diagram for explaining data items stored in a database.

FIG. 2 shows a configuration of data stored in the database 22. As can be seen from FIG. 2, the database 22 includes a sensor data file 221 in which the sensor data is filed for each wafer and a data management table 222 in which the wafer processing information and a correspondence list between the wafer processing information and the sensor data file are stored. The database copy 42 of the copy server 4a includes a sensor data file copy 421 and data management table copy 422 which are copies of part or all of the sensor data file 221 and the data management table 222, respectively. Since the sensor data has a large amount of data as described above, it is favorable to transfer the data to the copy server 4a in a free period of time of the data collector 2 or each time the data is received from each sensor. Since the size of each record in the data management table 222 is small, it is favorable to transfer the data at a time when the wafer processing is terminated or when the processing of a lot is terminated.

Figure 3:
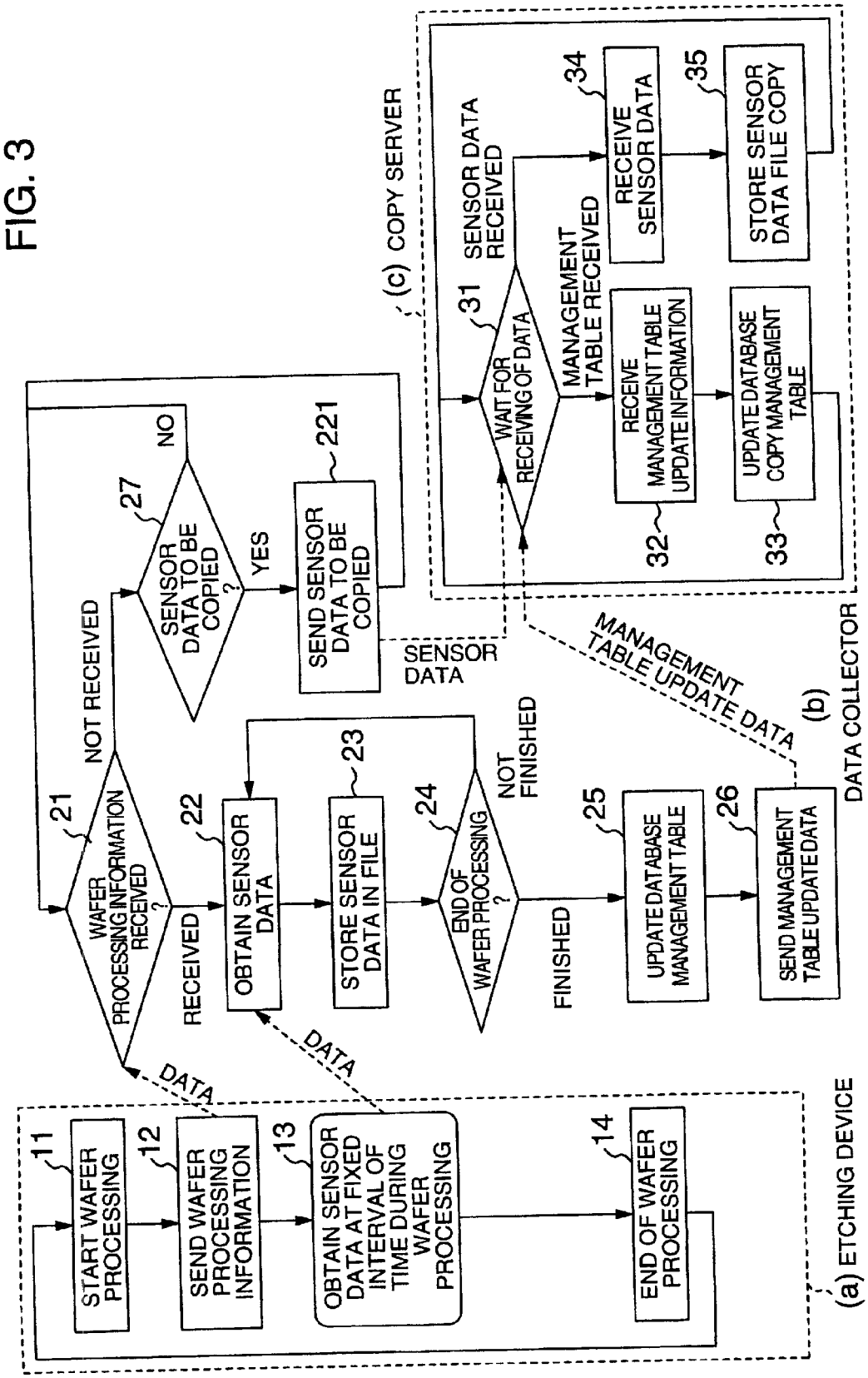
FIG. 3 is a flowchart for explaining processing of a data processing apparatus for a semiconductor manufacturing apparatus.

FIG. 3 is a flowchart to explain processing of the data processing apparatus for a semiconductor manufacturing apparatus according to the present embodiment. The flowchart includes part (a) "processing of the etching system 1", part (b) "processing of the data collector 2", and part (c) "processing of the data copying semiconductor device 4a".

First, in flowchart part (a) of the etching system 1, the system 1 starts wafer processing in step 11. In step 12, the controller 15 outputs wafer processing information such as a wafer processing recipe, a type of semiconductor chip on the wafer, a wafer number, and a processing lot number to the data collector 2. In step 13, the data collector 2 can acquire sensor data at a predetermined interval of time during the wafer processing. In step 14, a check is made to determine whether or not the wafer processing has been terminated. If the processing has been terminated, control goes to step 15 to wait for the wafer processing of a subsequent wafer.

In flowchart part (b) of the data collector 2, whether or not the wafer processing information has been received from the etching system 1 is determined. If the information has been received, control goes to step 22. Otherwise, control goes to step 27. The collector 2 receives the sensor data in step 22 and then stores the data in the sensor data file 221 of the database 22. In step 24, the collector 2 determines whether or not the processing has been finished for the wafer. If the processing has been finished, the collector 2 updates the data management table 222 of the database 22 in step 25, and sends update information of the table 222 to the data copying semiconductor device 4a in step 26. In step 27, the collector 2 determines presence or absence of sensor data to be processed. If any sensor data remains for copy, the collector 2 sends the data to the copy server 4a.

In flowchart part (c) of the data copying semiconductor device 4a, the semiconductor device 4a waits for reception of data in step 31. When data of the data management table 222 is received, control goes to step 32, and then updates the data management table copy 422 in step 33. When sensor data is received, control goes to step 34, and then generates a sensor data file copy to store the file copy in the database copy 42.

Figure 4:
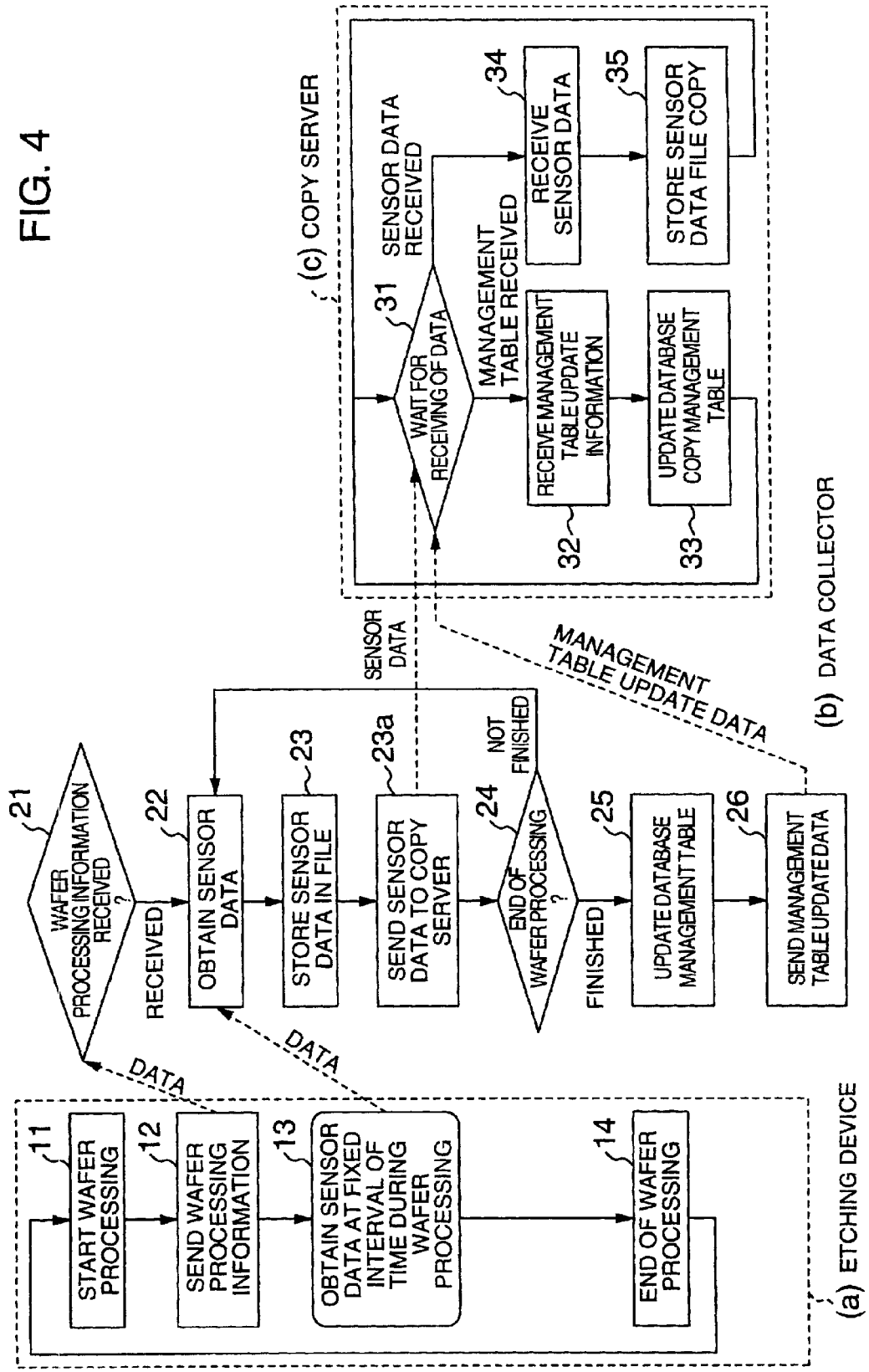
FIG. 4 is a flowchart for explaining another processing of a data processing apparatus for a semiconductor processing apparatus.

FIG. 4 shows a flowchart of another processing in the data processing apparatus for a semiconductor manufacturing apparatus in which the data processor 21 generates data for the database 22 and simultaneously transfers the data to the copying semiconductor device 4a. The flowchart includes part (a) "processing of the etching system 1", part (b) "processing of the data collector 2", and part (c) "processing of the data copying semiconductor device 4a". In FIG. 4, the same constituent components as those of FIG. 3 are assigned with the same reference numeral and description thereof will be avoided.

In the case shown in FIG. 4, the data collector 2 stores the sensor data in the sensor data file 221 of the database 22 in step 23 and then transfers the sensor data to the copy server 4a in step 23a. In this operation, the data can be transferred in a shorter period of time when compared with the case in which the data once stored in the database 22 is read therefrom and is then transferred to the copying semiconductor device 4a.

Figure 5:
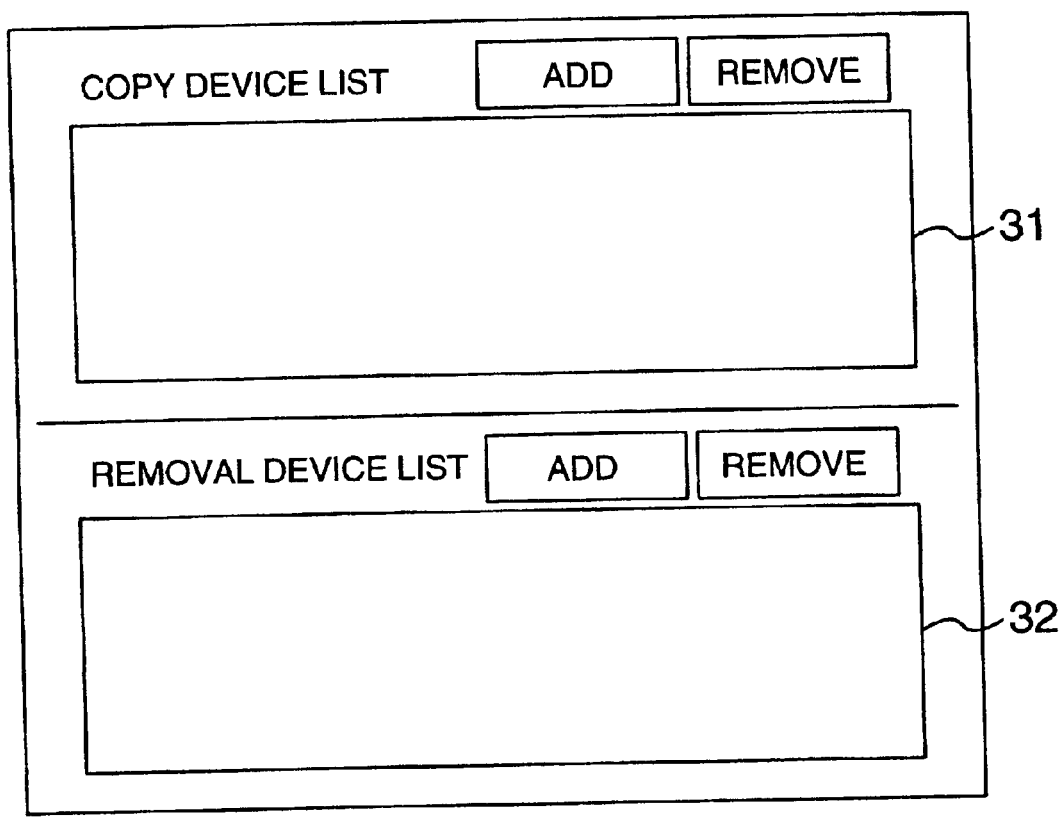
FIG. 5 is a diagram showing an example of an operation display screen presented on a display of a data copying semiconductor device.

FIG. 5 shows an example of an operation display screen presented on a display of the data copying semiconductor device 4a. In an actual system, the data analyzer 3 analyzes a part of the data stored in the database 22. For example, the analyzer 3 may analyze only a semiconductor device having quite fine structure in some cases. In such a case, the user can specify the type of wafers to be analyzed. For example only a type of device or a type of recipe is copied so that a small amount of data is copied onto the database copy 42 in the copying device 4a, for example, only a semiconductor device type or a recipe type as the copy condition so that the data is copied onto the database copy 42 of the copying semiconductor device 4a.

To specify the condition, the user inputs in a copy semiconductor device list display area 31 shown in FIG. 5 a list of semiconductor devices to be copied or the user inputs in a removal semiconductor device display area 32 a list of semiconductor devices to be excluded. Or, the user may specify or reserve a period of time to create a copy for the data collector 2. This is advantageously effective, for example, when a large-capacity recording semiconductor device cannot be used for the database copy 42 of the copy server 4a or when data is obtained for a long period of time for the analysis.

Incidentally, when the copy condition is inputted, an authentication technique may be employed. For example, a password is inputted to protect the copy of the data. As a result, only particular information protected by the password can be stored in the database copy to thereby prevent leakage of the information. Using the function, a semiconductor device maker of the system can limit a range of data to be presented to a vender of the apparatus. Alternatively, the apparatus vendor maker can limit a range of data to be presented to the semiconductor device maker.

Figure 6:
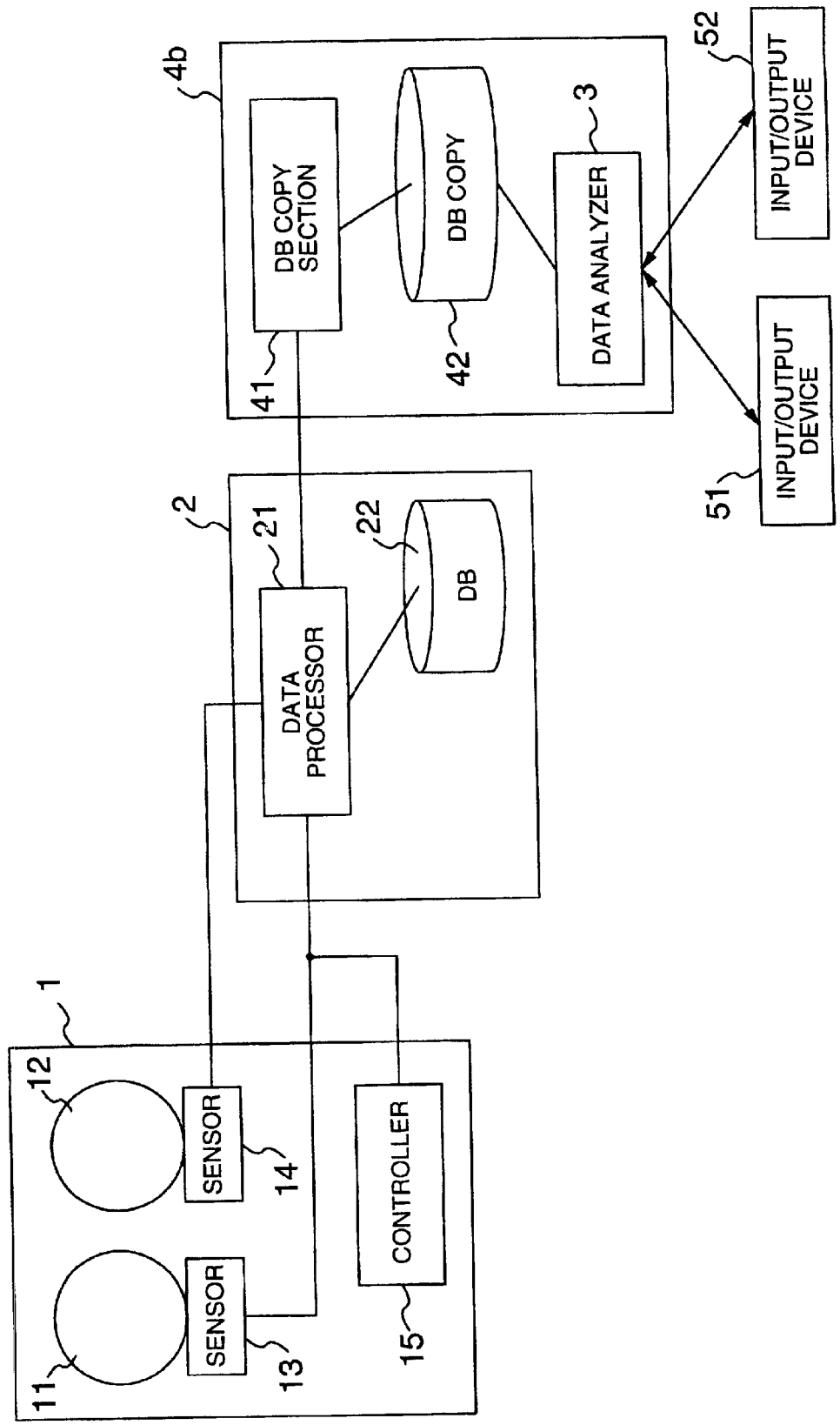
FIG. 6 is a diagram showing another embodiment of the present invention.

FIG. 6 shows a configuration of another embodiment of the present invention. The configuration includes a data analyzer 3 disposed in a copying semiconductor device 4b. By including the data analyzer 3, the copying semiconductor device 4b functions as a data analysis server. When the copying semiconductor device or the data analysis server is configured as a web application server, external input/output semiconductor devices 51 and 52 to be connected to the server can be easily implemented using a general web browser.

Figure 7:
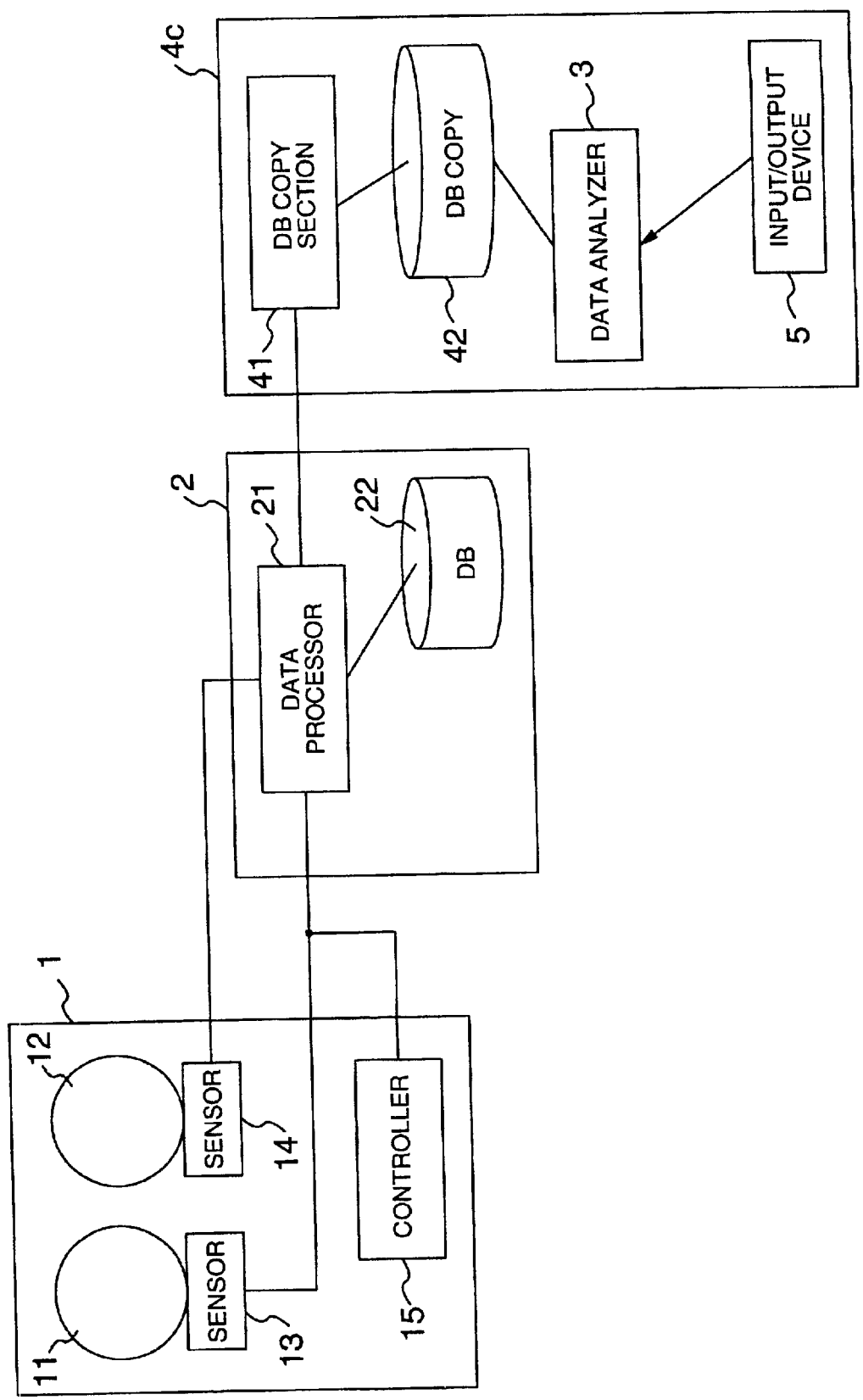
FIG. 7 is a diagram showing further another embodiment of the present invention.

FIG. 7 shows a configuration of still another embodiment of the present invention. The configuration includes a data analyzer 3 and an input/output semiconductor device 5 which are disposed in the copying semiconductor device 4c. The semiconductor device 4c is attached onto the data collector 2 such that the semiconductor device 4c can be removed from the collector 2 to be independently transported.

By constructing the copying semiconductor device 4c as a portable server or a portable analysis server, the semiconductor device 4c can be attached onto the data collector 2 so that data is analyzed according to necessity. That is, when the semiconductor device 4c is attached onto the data collector 2, the semiconductor device 4c can update the database copy 42 thereof for the analysis of data. Therefore, also when a client does not desire to install the data analyzer operating in a continuous fashion, it is possible to acquire data from the data collector 2. This function is especially convenient when an engineer of the apparatus vendor visits the site for repair, maintenance, or process tuning. He is able to plug his own copying device 4c into the data collector 2 so that the database copy 42 is synchronized with the original database 22.

FIG. 8 shows an example of the operation display screen of the copying semiconductor device 4c.

As described above, when the copying semiconductor device 4c is constructed as a portable server or a portable analysis server and is not continuously connected to the data collector 2, a large amount of data items not copied in the copying semiconductor device 4c remain in the data collector 2 depending on cases. In this situation, when the data collector 2 is connected to the copying semiconductor device 4c to start copying the data, the copying operation takes a long period of time and hence the analysis cannot be started. However, by specifying a condition of data items to be copied from the data collector 2 onto the data copying semiconductor device 4c before the copying is started, only the data necessary for the analysis can be copied. The condition of data items to be copied can be specified by, for example, a semiconductor device name formed on the wafer, a recipe name used for the wafer processing, or information of day and time of the processing as shown in FIG. 8.

Figure 9:
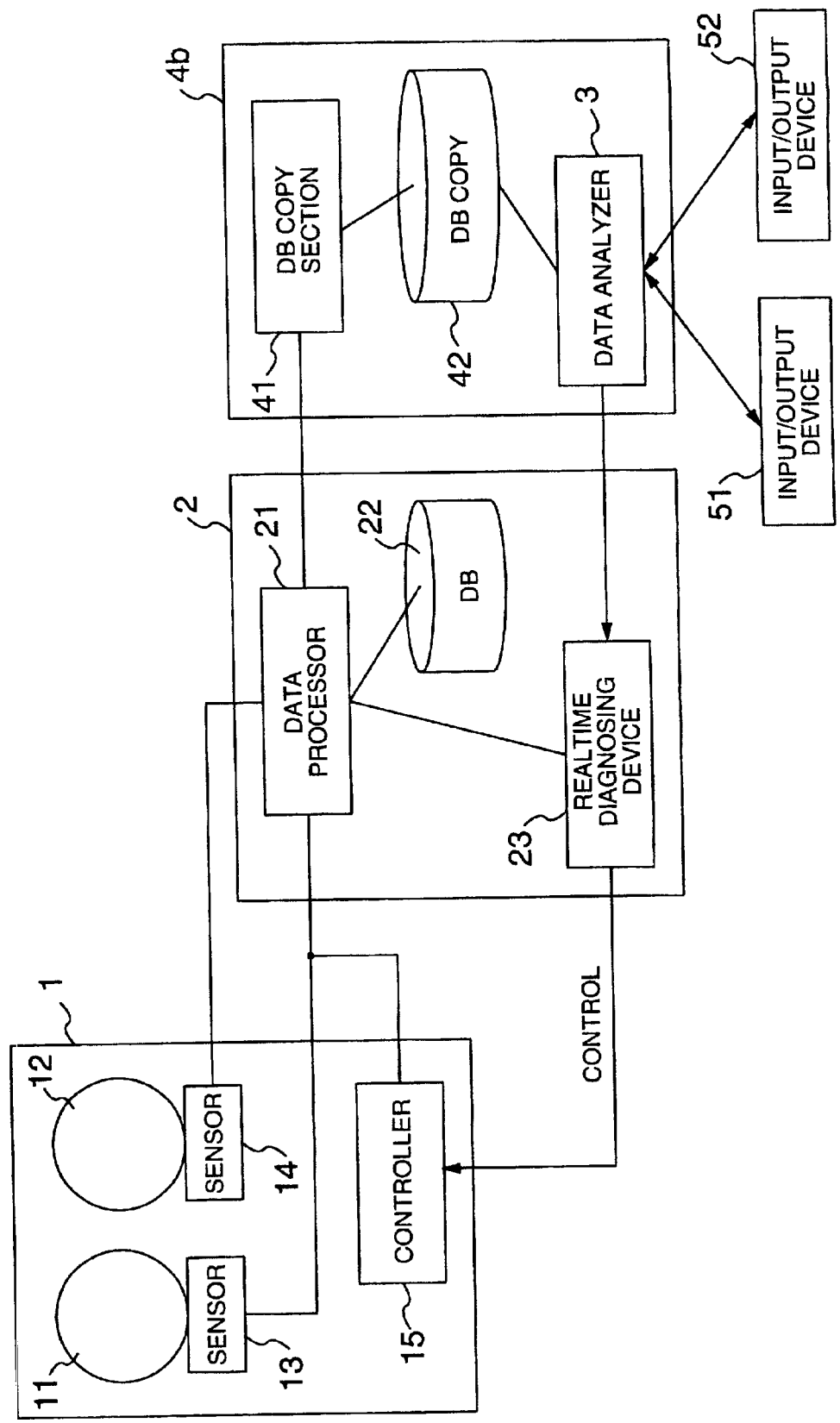
FIG. 9 is a diagram showing still another embodiment of the present invention.

FIG. 9 shows still another embodiment of the present invention. The configuration of FIG. 9 includes a realtime diagnosing semiconductor device 23 to diagnoses, for example, an end point of processing of the etching system 1 in a realtime fashion. The device is embedded in the data collector 2 and high speed data exchange between th data processor 21 and the diagnosing device 23 is established. The configuration also includes a data analyzer 3 disposed in the data copying semiconductor device or an analysis server 4b. The analyzer 3 generates information necessary for the diagnosis in the diagnosing semiconductor device 23, for example, a determining criterion to determine the end point or a model formula for the diagnosis and then sends the information to the realtime diagnosing semiconductor device 23.

In the diagnosis using the data analyzer 3 of the data copying semiconductor device 4b, a long period of time is required before the diagnosis is started. Therefore, this operation is not suitable for the realtime diagnosis in some cases. However, by disposing the realtime diagnosing semiconductor device 23 in the data collector 2, the diagnosis can be immediately carried out.

Figure 10:
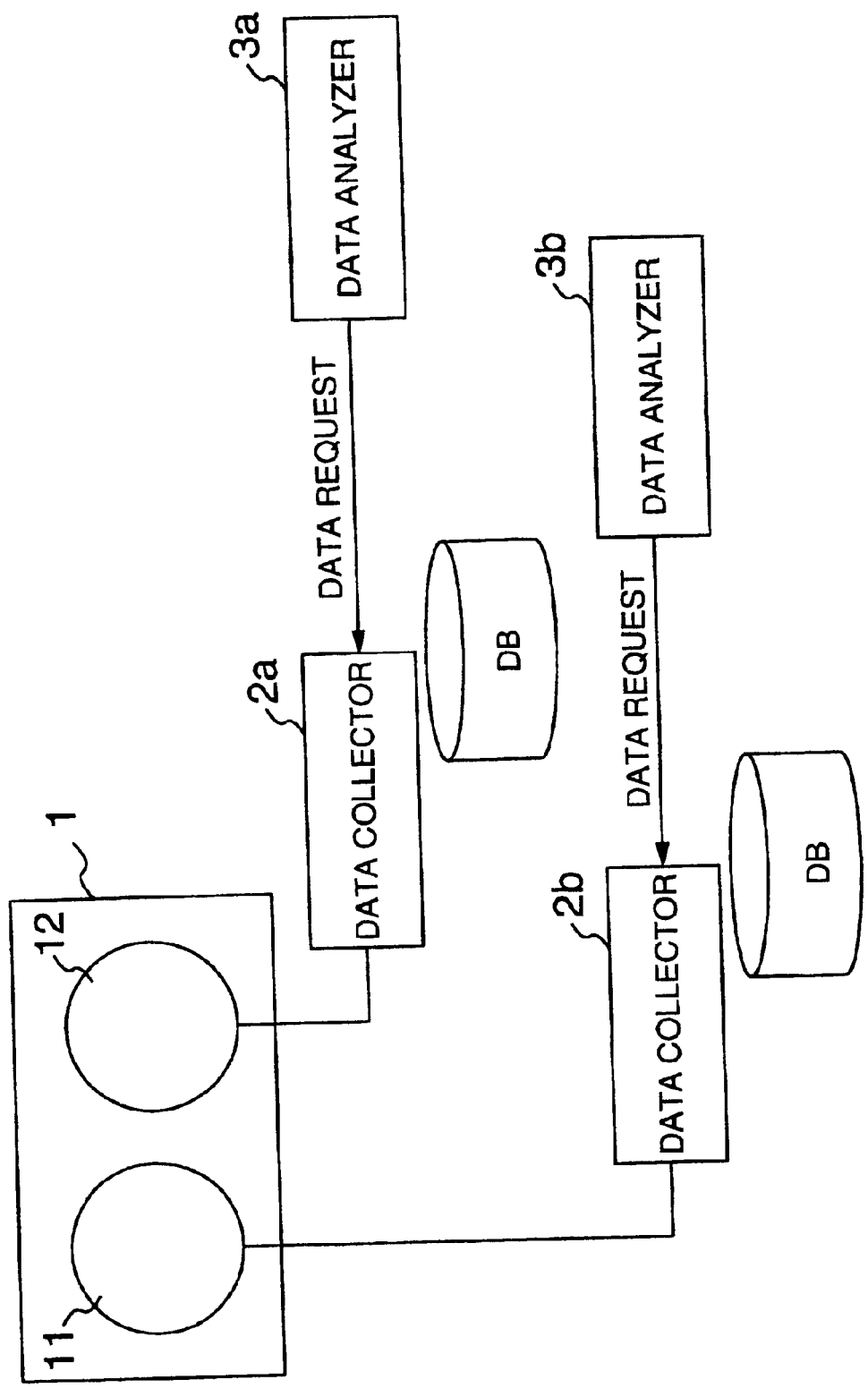
FIG. 10 is a diagram showing another embodiment of the present invention.

FIG. 10 shows further another embodiment of the present invention. The configuration of FIG. 10 includes data collectors 2a and 2b and data analyzers 3a and 3b. As can be seen from the configuration, the etching system 1 includes a plurality of etching chambers 11 and 12. The data collector 2a and the data analyzer 3a are disposed for the etching chamber 11 and the data collector 2b and the data analyzer 3b are disposed for the etching chamber 12.

By disposing a data collector and a data analyzer for each etching chamber, the data analyzer can transfer data from the data collector to the data analyzer using a free processing period of time between the continuous wafer processing of the etching chamber.

Figure 11:
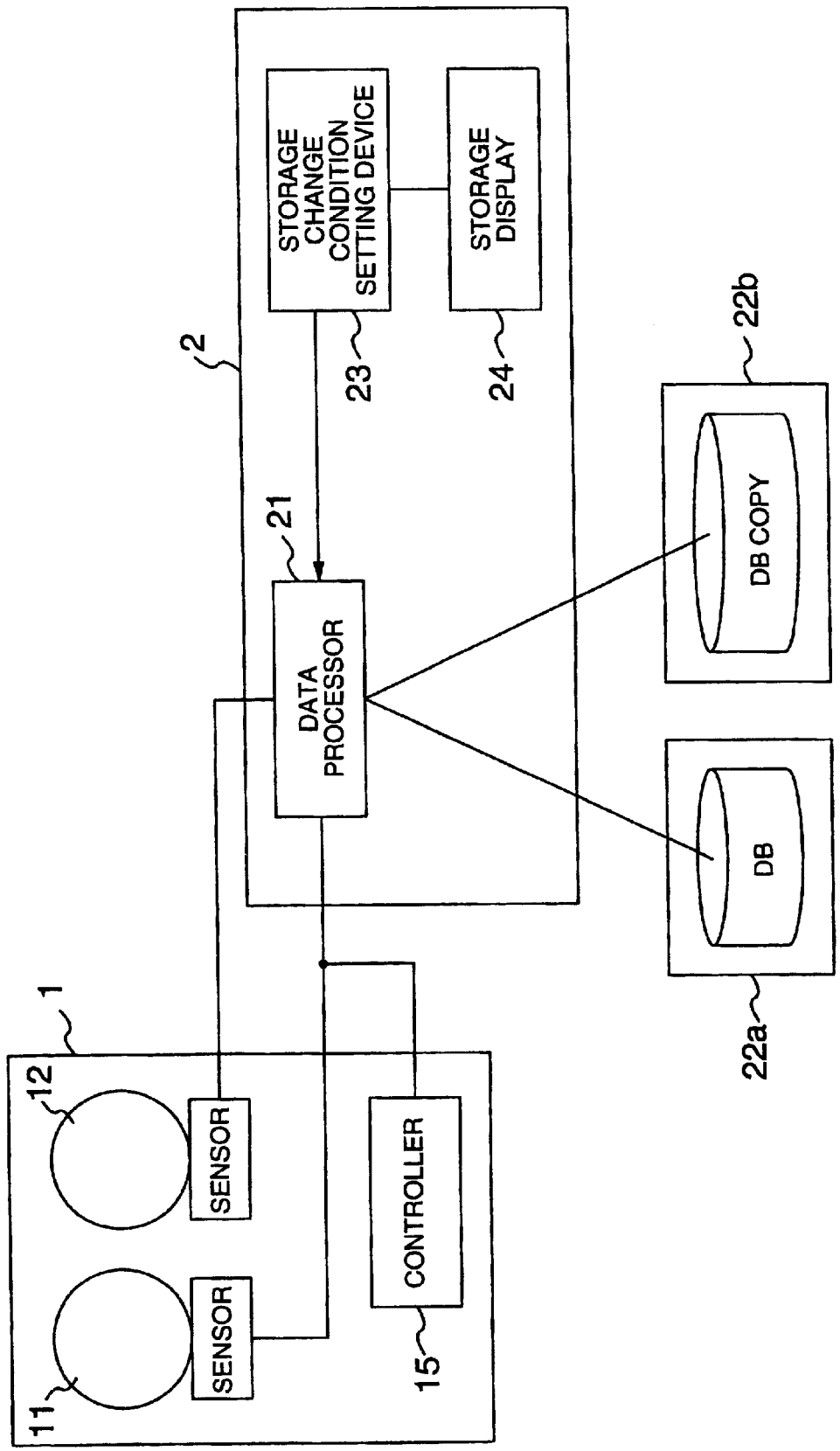
FIG. 11 is a diagram showing still another embodiment of the present invention.

FIG. 11 shows still another embodiment of the present invention. The embodiment includes external databases 22a and 22b disposed at positions outside the data collector 2. The data collector 2 stores collected data in either one of the external storages 22a and 22b according to a storage change condition set by a data storage change condition setting semiconductor device 23. A storage change condition can be set from an external semiconductor device to the condition setting semiconductor device 23. The embodiment further includes a display 24 to display, for example, all storages or a storage being currently used.

The external storage may be a hard disk or a semiconductor memory. By connecting these external storage via, for example, a local area network (LAN) to the data analyzer, data can be obtained from the external storage not connected to the data collector 2 to analyze the data without taking the load imposed on the data collector 2 into consideration.

The external storage may also include removable media such as a removable hard disk, a removable digital video disk (DVD), a removable magnetooptical disk, and a zip drive (trademark) and so on. If the storage is constructed such that the body of media is ejected from the storage when the data collection is finished, the operator can easily collect the media. When such a removable media is employed as the external storage, the removable media can be incorporated into the data collector 2.

The storage change condition may be automatically set according to the capacity of the external storage. However, it is more convenient if the user can set the condition. The storage change condition may be specified by information of "day and time" or information for a periodic specification such as "Monday every week". Or, the condition may be a point of time when samples of a specified number of lots are completely processed. The storage where the data collector 21 is updating the database is called 'active storage'. The operator can specify a storage change condition such that when the active storage is changed. After the storage change condition is fulfilled, the data collector 21 starts to store the database into another storage so that the storage for which the storing operation is finished is released from updating tasks. Thereafter, the operator may produce a backup copy of the database in the released storage. Or, if the storage is removable device, the operator can just pick up the removable media containing data. It is preferable that when the active storage is changed, the event is displayed on the storage display or a notification is sent to the operator via e-mail.

According to the embodiments described above, it is possible to provide a data processing apparatus for a semiconductor manufacturing apparatus with high usability in which the period of time required for the processing is reduced. Since a data collector and a data analyzer are disposed for each etching chamber in the processing chamber of the semiconductor manufacturing apparatus, the period of free time to be allocated to data processing such as a data extraction request of the data analyzer can be sufficiently guaranteed. Therefore, the load imposed on the data collector can be reduced. The data collector is connected to a plurality of external storages such that the storages are appropriately changed in the operation. This advantageously reduces the load imposed on the data collector, for example, for a data extraction request of the data analyzer. The collected data can be easily controlled.

According to the present invention described above, it is possible to provide a data processing apparatus for a semiconductor manufacturing apparatus with high usability in which the period of time required for the processing is reduced.

It should be further understood by those skilled in the art that the foregoing description has been made on embodiments of the invention and that various changes and modifications may be made in the invention without departing from the spirit of the invention and the scope of the appended claims.

What is claimed is:

1. A semiconductor processing apparatus, comprising:
a chamber in which at least one sample wafer as a processing object is processed;
a data collecting device for collecting and storing process data which is generated during processing of said at least one sample wafer, said process data including emission data generated within said chamber; and
a data storing device for storing data to be analyzed which is included in process data generated during a processing of another sample wafer, said data storing device enabling supply of said data stored therein at least while said data collecting device collects or stores said process data therein.

2. A semiconductor processing apparatus according to claim 1, wherein said data storing device stores therein a copy of the data stored in said data collecting device.

3. A semiconductor processing apparatus to claim 1, wherein said data to be analyzed which is included in said process data stored in said data collecting device is transferable to said data storing device.

4. A data processing apparatus for said semiconductor processing apparatus according to any one of claims 1 to 3, wherein said data storing device is attachable to said semiconductor processing apparatus so as to be detachable therefrom and installable to said semiconductor processing device.

5. A semiconductor processing apparatus according to claim 1 or claim 3, further comprising:
a data analyzing device for analyzing said data stored in said data storing device;
wherein said data analyzing device performs the analysis during operation of said data collecting device.

6. A data processing apparatus for said semiconductor processing apparatus according to claim 5, wherein said data storing device is attachable to said semiconductor processing apparatus so as to be detachable therefrom and installable to said semiconductor processing device.

7. A semiconductor processing apparatus according to claim 1 or claim 3, further comprising:
a diagnosis device for diagnosing an operation of said semiconductor processing apparatus using said data stored in said data storing device;
wherein said diagnosis device performs the diagnosis during operation of said data collecting device.

8. A data processing apparatus for said semiconductor processing apparatus according to claim 7, wherein said data storing device is attachable to said semiconductor processing apparatus so as to be detachable therefrom and installable to said semiconductor processing device.

* * * * *